US008018402B2

(12) United States Patent
Kim et al.

(10) Patent No.: US 8,018,402 B2
(45) Date of Patent: Sep. 13, 2011

(54) ORGANIC LIGHT EMITTING DISPLAY DEVICE AND TESTING METHOD THEREOF

(75) Inventors: Tae Gyu Kim, Yongin-si (KR); Jin Tae Jeong, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 851 days.

(21) Appl. No.: 11/688,718

(22) Filed: Mar. 20, 2007

(65) Prior Publication Data

US 2007/0262929 A1    Nov. 15, 2007

(30) Foreign Application Priority Data

Apr. 7, 2006  (KR) ........................ 10-2006-0032076

(51) Int. Cl.
*G09G 3/30* (2006.01)
(52) U.S. Cl. .......................... 345/76; 345/100
(58) Field of Classification Search ............ 345/98–100, 345/204, 36, 44–46, 76–83; 315/169.3, 169.1; 313/463; 324/765, 767, 770; 438/14–18; 257/48, 59
See application file for complete search history.

(56) References Cited

U.S. PATENT DOCUMENTS

| | | | |
|---|---|---|---|
| 6,023,260 A | 2/2000 | Higashi | |
| 6,639,646 B2 * | 10/2003 | Lim | 349/187 |
| 6,677,171 B1 * | 1/2004 | Nagata et al. | 438/17 |
| 6,731,368 B2 * | 5/2004 | Yu et al. | 349/187 |
| 6,825,911 B2 * | 11/2004 | Lee et al. | 349/192 |
| 6,909,417 B2 * | 6/2005 | Washio et al. | 345/98 |
| 7,633,469 B2 * | 12/2009 | Kawata | 345/76 |
| 2001/0052788 A1 * | 12/2001 | Tomita | 324/765 |
| 2002/0063843 A1 | 5/2002 | Yu et al. | |
| 2003/0122975 A1 * | 7/2003 | Kim et al. | 349/40 |
| 2003/0179164 A1 * | 9/2003 | Shin et al. | 345/76 |
| 2003/0193459 A1 * | 10/2003 | Kim et al. | 345/87 |
| 2005/0035958 A1 * | 2/2005 | Moon | 345/204 |
| 2005/0218926 A1 * | 10/2005 | Hiroki | 324/770 |
| 2006/0044230 A1 * | 3/2006 | Eom | 345/76 |

FOREIGN PATENT DOCUMENTS

CN          1145678 A         3/1997
(Continued)

OTHER PUBLICATIONS

SIPO Office Action dated Jan. 23, 2009 in corresponding China Patent Application No. 200710096830.9, with English translation indicating relevance of cited references in this IDS.

(Continued)

*Primary Examiner* — Amare Mengistu
*Assistant Examiner* — Hong Zhou
(74) *Attorney, Agent, or Firm* — Christie, Parker & Hale, LLP

(57) ABSTRACT

An organic light emitting display device and a testing method thereof is provided. The organic light emitting display device may be used to perform a test of a sheet unit for a plurality of organic light emitting display devices formed on a mother substrate. The organic light emitting display device can separately turn off particular organic light emitting display devices. A display region includes a plurality of pixels, which are connected to scan lines and data lines. A scan driver supplies a scan signal to the scan lines. A peripheral region surrounds the display region and includes a first wiring group extending in a first direction and a second wiring group extending in a second direction. A transistor group includes a plurality of transistors, which are coupled with one end of the data lines. An on/off controller is coupled with at least one wiring of the first wiring group and at least one wiring of the second wiring group.

12 Claims, 10 Drawing Sheets

FOREIGN PATENT DOCUMENTS

| | | |
|---|---|---|
| EP | 1 517 287 A2 | 3/2005 |
| EP | 1 763 014 A1 | 3/2007 |
| JP | 07-199872 | 8/1995 |
| JP | 2003-043945 | 2/2003 |
| JP | 2003-107136 | 4/2003 |
| JP | 2003-124276 | 4/2003 |
| JP | 2003-271067 | 9/2003 |
| JP | 2006-054450 | 2/2006 |
| KR | 1997-7002545 | 5/1997 |
| KR | 2002-0041212 | 6/2002 |
| KR | 10-2004-0088211 | 10/2004 |
| KR | 10-2005-0003255 | 1/2005 |
| KR | 10-0504473 | 8/2005 |
| KR | 10-2007-0001583 | 1/2007 |

OTHER PUBLICATIONS

Korean Patent Abstracts for corresponding Korean Patent Registration KR 10-0504473; Publication No. 1020040028363 A; Publication Date: Apr. 3, 2004; in the name of Chang Nam Kim, et al.

European Search Report dated May 20, 2009, for corresponding European application 07251545.5, noting listed references in this IDS.

Korean Patent Abstracts, Publication No. 1020020041212 A; Date of Publication: Jun. 1, 2002; in the name of Gyu Su Cho et al.

Korean Patent Abstracts, Publication No. 1020040088211 A; Date of Publication: Oct. 16, 2004; in the name of Ji Yong Jung.

Korean Patent Abstracts, Publication No. 1020050003255 A; Date of Publication: Jan. 10, 2005; in the name of June Ho Park.

Korean Patent Abstracts, Publication No. 1020070001583 A; Date of Publication: Jan. 4, 2007; in the name of Won Kyu Kwak.

Notice of Allowance dated Aug. 29, 2007 for corresponding Korean Patent Application No. 10-2006-0032076.

Japanese Office action dated Jan. 5, 2010 of the Japanese Patent Application No. 2006-193036, which claims priority of the corresponding Korean Priority Application No. 10-2006-0032076.

European Search Report dated Jul. 13, 2010, for corresponding European Patent application 07251545.5, noting listed reference in this IDS.

* cited by examiner

ORGANIC LIGHT EMITTING DISPLAY DEVICE AND TESTING METHOD THEREOF

CROSS-REFERENCE TO RELATED APPLICATIONS

This application claims priority to and the benefit of Korean Patent Application No. 2006-0032076, filed in the Korean Intellectual Property Office on Apr. 7, 2006, the entire content of which is incorporated herein by reference.

BACKGROUND

1. Field of the Invention

The present invention relates to an organic light emitting display device and a testing method thereof, and more particularly to an organic light emitting display device and a testing method thereof.

2. Discussion of Related Art

In general, after a plurality of organic light emitting display devices are formed on one mother substrate, they are scribed to be divided into individual organic light emitting display devices. Tests are then performed on each individual organic light emitting display device that has been scribed from the mother substrate.

FIG. 1 shows a scribed organic light emitting display device. The conventional organic light emitting display device 110 includes a scan driver 120, a data driver 130, a data distributor 140, and a display region 150.

The scan driver 120 generates a scan signal. The scan signal generated by the scan driver 120 are provided sequentially to scan lines S1 through Sn.

The data driver 130 generates a data signal. The data signal generated by the data driver 130 is supplied to output lines O1 through Om.

The data distributor 140 provides the data signal from the respective output lines O1 to Om of the data driver 130 to at least two data lines D. The data distributor 140 reduces the number of channels of the data driver 130.

The display region 150 includes a plurality of pixels (not shown), each having an organic light emitting diode. The display region 150 displays an image, receiving power from the external first and second power supplies ELVDD and ELVSS, receiving the scan signal from the scan driver 120, and receiving the data signal from the data distributor 140.

The test for the organic light emitting display device 110 is performed on individual organic light emitting display devices. When the circuit wiring or the size of the organic light emitting display device 110 changes, the testing equipment or a jig for the test must be changed. Separately testing such organic light emitting display devices 110 takes additional time to test and is costly, therefore testing efficiency is deteriorated.

SUMMARY OF THE INVENTION

In order to improve testing efficiency, tests for the plurality of organic light emitting display devices are performed in sheet units on the mother substrate before the organic light emitting display devices are scribed.

When an abnormal organic light emitting display device exists on the mother substrate, some tests of the organic light emitting display devices 110 cannot be properly performed. Therefore, in order to increase the reliance and efficiency of the tests, it is necessary to prevent a particular defective organic light emitting display device from influencing the test results for the non-defective organic light emitting display devices 110. To do this, tests of the sheet unit on the mother substrate must be performed such that particular organic light emitting display devices are separately turned off on the mother substrate.

Accordingly, one aspect of the present invention is to provide an organic light emitting display device and a testing method thereof, which may perform a test of a sheet unit for a plurality of organic light emitting display devices formed on a mother substrate.

Another object of the present invention is to provide an organic light emitting display device and a testing method thereof, which can separately turn off particular organic light emitting display devices formed on a mother substrate.

The foregoing and other aspects of the present invention are achieved by providing an organic light emitting display device including a display region including a plurality of pixels, which are connected to scan lines and data lines; a scan driver for supplying a scan signal to the scan lines; a first wiring group disposed at a peripheral region and extending in a first direction; a second wiring group disposed at the peripheral region and extending in a second direction; a transistor group including a plurality of transistors, which are coupled with one end of the data lines; and an on/off controller coupled with at least one wiring of the first wiring group and at least one wiring of the second wiring group.

In one embodiment, the on/off controller includes a control signal generator for generating at least one shift control signal corresponding to signals from the first and second wiring groups; and a shift clock signal generator coupled with an output terminal of the control signal generator, wherein the shift clock generator is capable of generating first and second shift clock signals according to the shift control signal. In another embodiment, the plurality of transistors of the transistor group are adapted to maintain a turned off state according to an external control signal. In another embodiment, the organic light emitting display further includes a data distributor coupled between the data lines and the transistor group, for supplying a testing signal or a data signal to the data lines according to at least two select signals; and a data driver for supplying the data signal to the data distributor.

A second aspect of the present invention includes a method for testing a plurality of organic light emitting display devices located on a mother substrate, the method including supplying a vertical control signal to a first wiring group coupled with the organic light emitting display devices disposed in the same column; supplying a horizontal control signal to a second wiring group coupled with the organic light emitting display devices disposed in the same row; generating first and second shift clock signals corresponding to the vertical control signal and the horizontal control signal; generating a scan signal corresponding to the first and second shift clock signals; supplying a testing signal to the first or second wiring group; and displaying an image for a test corresponding to the scan signal and the testing signal.

In one embodiment, wherein generating a first shift clock signal and a second shift clock signal includes generating at least one shift control signal corresponding to the vertical control signal and the horizontal control signal; and generating the first and second shift clock signals corresponding to the shift control signal. Another embodiment includes generating the scan signal so that at least one organic light emitting display device among the organic light emitting display devices does not display an image according to the vertical control signal and the horizontal control signal. Another embodiment includes turning off switching transistors of pixels included in a display region of the at least one organic light emitting display device among the organic light emitting display devices. In another embodiment, the method further includes receiving a first clock signal through the first or second wiring group. Another embodiment includes generating a first shift clock signal having the same waveform as that of the first clock signal and a second shift clock signal having a waveform inverted to that of the first shift clock signal that correspond to the vertical control signal and the horizontal control signal. In another embodiment, the method further includes generating an emission control signal to control a display of an image for a test in the organic light emitting display devices according to the first and second shift clock signals.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION

Figure 1:
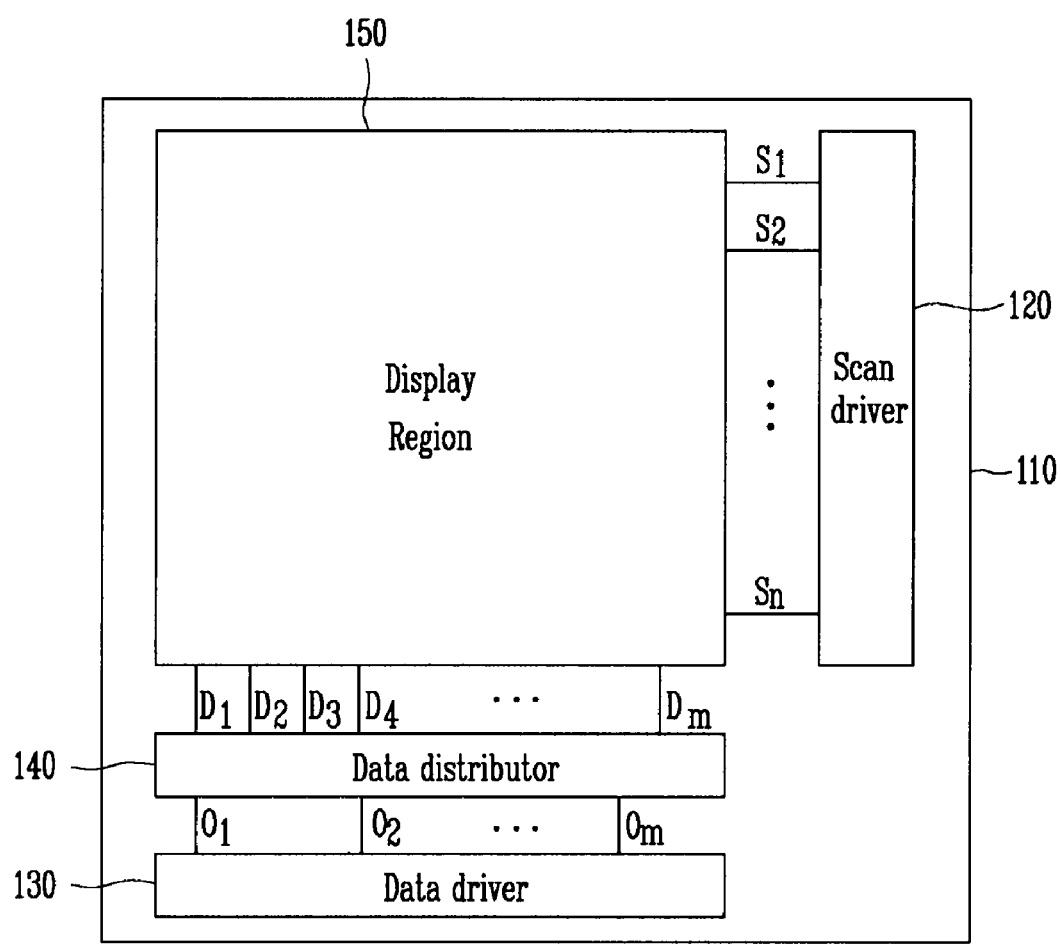
FIG. 1 shows an organic light emitting display device that has been scribed from the mother substrate.
Figure 2:
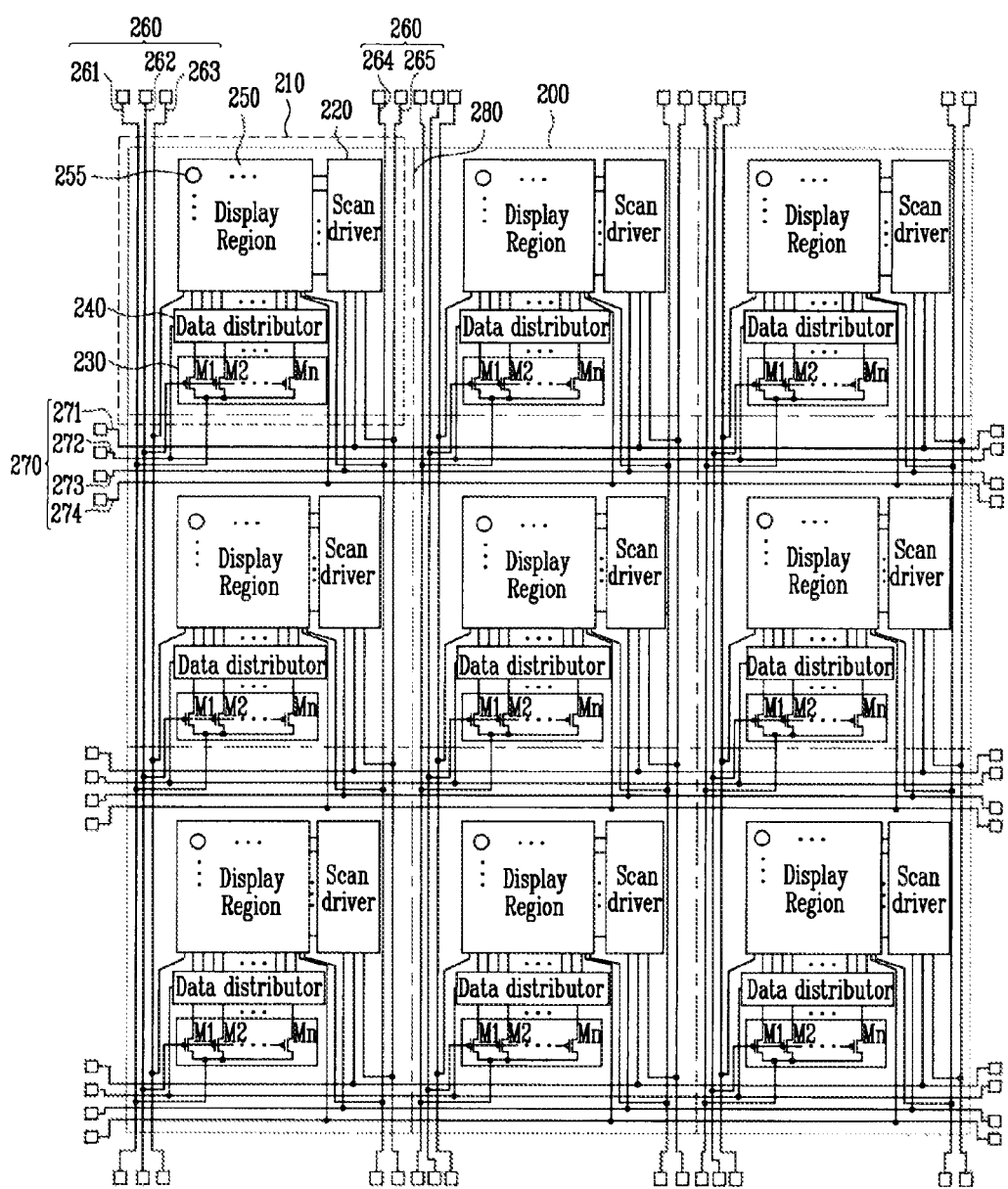
FIG. 2 shows a mother substrate of an organic light emitting display device according to a first embodiment of the present invention.

FIG. 2 shows a mother substrate of an organic light emitting display device according to a first embodiment of the present invention. The mother substrate 200 includes a plurality of organic light emitting display devices 210, a first wiring group 260, and a second wiring group 270. The plurality of organic light emitting display devices 210 are arranged in a matrix form. The first wiring group 260 and the second wiring group 270 are disposed at a peripheral region of each of the organic light emitting display devices 210.

Each of the organic light emitting display devices 210 includes a scan driver 220, a testing section 230, a data distributor 240, and a display region 250.

The scan driver 220 receives a third power supply VDD from a fifth wiring 265 included in the first wiring group 260, and a scan control signal and a fourth power supply VSS from a sixth wiring 271 and an eighth wiring 273 included in the second wiring group 270, respectively. The scan driver 220 generates a scan signal and an emission control signal corresponding to the third and fourth power supplies VDD and VSS and the scan control signal. The scan signal and the emission control signal generated by the scan driver 220 are provided to the display region 250.

The testing section 230 includes a plurality of transistors M1 to Mn, which are coupled between a first wiring 261 of the first wiring group 260 and the data distributor 240. Respective gates of the transistors M1 to Mn are coupled with a second wiring 262 of the first wiring group 260. The testing section 230 supplies a testing signal supplied from the first wiring 261 to the data distributor 240 according to a testing control signal supplied from the second wiring 262. Here, the testing signal is used to determine whether or not the organic light emitting display device 210 is abnormal. A lighting testing signal or a leakage current testing signal is used as a testing signal for pixels included in the display region 250.

The data distributor 240 receives at least two select signals from a seventh wiring 272 included in the second wiring group 270. Although one wiring is shown as the seventh wiring 272 in FIG. 2, at least two wirings can be set corresponding to the number of select signals as the seventh wiring 272. For example, the data distributor 240 may receive clock signals CLR, CLG, and CLB of red, green, and blue sub-pixels from the seventh wiring 272. In this case, the seventh wiring 272 is formed by three wirings. The data distributor 240 provides a testing signal from respective output lines of the testing section 230 to at least two data lines corresponding to a select signal at the testing time of the sheet unit. On the other hand, after the respective organic light emitting display devices 210 are scribed, the data distributor 240 provides a data signal from respective output lines of a data driver (not shown) to at least two data lines corresponding to an externally supplied select signal.

The display region 250 includes a plurality of pixels 255, each having an organic light emitting diode. The display region 250 receives a second power supply ELVSS and an initialization power supply Vinit from a third wiring 263 and a fourth wiring 264 of the first wiring group 260, respectively, and receives a first power supply ELVDD from a ninth wiring 274 of the second wiring group 270. Further, the display region 250 receives a scan signal and an emission control signal from the scan driver 220, and receives a testing signal (or data signal) from the data distributor 240. The display region 250 displays a predetermined image corresponding to the first and second power supplies ELVDD and ELVSS, the initialization power supply Vinit, the scan signal, the emission control signal, and the testing signal (or data signal).

Although it is not shown, each of the organic light emitting display devices 210 may further include a data driver. After the respective organic light emitting display devices 210 are scribed from the mother substrate 200, the data driver generates and provides a data signal to the data distributor 240 corresponding to externally supplied data. The data driver can be mounted to be overlapped with the testing section 230.

The first wiring group 260 is formed in a vertical direction (first direction), and is coupled with the organic light emitting display devices 210 arranged in the same column on the mother substrate 200. The first wiring group 260 includes the first wiring 261 for receiving a testing signal, the second wiring 262 for receiving a testing control signal, the third wiring 263 for receiving a second power supply ELVSS, the fourth wiring 264 for receiving an initialization power supply Vinit, and the fifth wiring 265 for receiving a third power supply VDD.

The first wiring 261 provides a testing signal to the testing section 230, which is formed at the organic light emitting display devices 210 and is connected to the first wiring 261.

The second wiring 262 provides a testing control signal to the testing section 230, which is formed at the organic light emitting display devices 210 and is connected to the second wiring 262.

The third wiring 263 provides a second power supply VSS at the time of testing the sheet unit to the display region 250, which is formed at the organic light emitting display devices 210 and is connected to the third wiring 263.

The fourth wiring 264 provides an initialization power supply Vinit at the time of testing the sheet unit to the display region 250, which is formed at the organic light emitting display devices 210 and is connected to the fourth wiring 264.

The fifth wiring 265 provides a third power supply VDD at the time of testing the sheet unit to a scan driver 220, which is formed at the organic light emitting display devices 210 and is connected to the fifth wiring 265.

The second wiring group 270 is formed in a horizontal direction (second direction), and is coupled with the organic light emitting display devices 210 arranged in the same row on the mother substrate 200. The second wiring group 270 includes a sixth wiring 271 for receiving a scan control signal, a seventh wiring 272 for receiving at least two select signals, an eighth wiring 273 for receiving a fourth power supply VSS, and a ninth wiring 274 for receiving a first power supply ELVDD.

The sixth wiring 271 provides the scan control signal at the time of testing the sheet unit to the scan driver 220, which is formed at the organic light emitting display devices 210 and is connected to the sixth wiring 271. The scan control signal may include a clock signal, an output enable signal, and a start pulse of the scan driver 220. In practice, the number of signals in the scan control signal supplied to the scan driver 220 can be changed according to the circuit arrangement of the scan driver 220. Accordingly, although the sixth wiring 271 is shown in FIG. 2 as one wiring, the sixth wiring 271 can have more than one wiring.

The seventh wiring 272 provides at least two select signals at the time of testing the sheet unit to the data distributor 240, which is formed at the organic light emitting display devices 210 and is connected to the seventh wiring 272. The number of the select signals may change according to the number of sub-pixels included in the display region 250. Accordingly, although the seventh wiring 272 is shown in FIG. 2 as one wiring, the number of wirings of the seventh wiring 272 can vary corresponding to the number of select signals.

The eighth wiring 273 provides a fourth power supply VSS at the time of testing the sheet unit to the scan driver 220, which is formed at the organic light emitting display devices 210 and is connected to the eighth wiring 273.

The ninth wiring 274 provides a first power supply ELVDD at the time of testing the sheet unit to the display region 250, which is formed at the organic light emitting display devices 210 and is connected to the ninth wiring 274.

After the sheet unit is tested, the organic light emitting display devices formed on the mother substrate 200 are scribed to individual organic light emitting display devices 210. After scribing, the first wiring group 260 and the second wiring group 270 are electrically isolated from the scan driver 220, the testing section 230, the data distributor 240, and the display region 250. That is, electric coupling points of the first and second wiring group 260 and 270, the scan driver 220, the testing section 230, the data distributor 240, and the display region 250 are positioned at a peripheral region of a scribing line of the organic light emitting display 210. Accordingly, noise such as static electricity introduced to the first and second wiring groups 260 and 270 from an exterior, is not provided to the scan driver 220, the testing section 230, the data distributor 240, and the display region 250.

The first embodiment includes the first and second wiring groups 260 and 270. Because the mother substrate 200 of the organic light emitting display device includes the first and second wiring groups 260 and 270, the test of the sheet unit for a plurality of organic light emitting display devices 210 formed on the mother substrate 200 can be performed before the organic light emitting display devices 210 are scribed. By supplying power supplies and signals for the test of the sheet unit to the first and second wiring groups 260 and 270, testing the organic light emitting display devices 210 may be performed. As a result, testing time and costs are reduced, thereby increasing the efficiency of testing the organic light emitting display devices. Further, although the circuit wiring constituting the organic light emitting display device 210 and the size of the mother substrate 200 may change, if the circuit wirings of the first and second wiring groups 260 and 270 and the size of the mother substrate 200 do not change, the test may be performed without changing the test equipment and the jig.

According to the embodiment, by supplying power supplies and signals to only the first and second wiring groups 260 and 270 coupled with at least one selected organic light emitting display device 210 among the organic light emitting display devices 210 formed on the mother substrate 200, a test for only the selected organic light emitting display 210 may be carried out. For example, by controlling the supply of the first and second power supplies ELVDD and ELVSS to the third wiring 263 of the first wiring group 260 and the ninth wiring 274 of the second wiring group 270, respectively, the selected organic light emitting display device 210 may be individually tested.

However, when an organic light emitting display device 210 included in the test has a scan driver 220 that is operating erroneously due to an internal defect or the delay of a supplied test signal, the test for the other organic light emitting display devices 210 in the same row or column may not be properly performed.

That is, when an organic light emitting display device 210 having at least one defect exists on the mother substrate 200, a proper signal is not inputted to the organic light emitting display devices 210 sharing a power supply line or a signal line with each other. Accordingly, it becomes difficult to perform a reliable test of the organic light emitting display devices 210.

In addition, when the power supplies and the signals supplied to the first and second wiring groups 260 and 270 pass through the internal wiring, a delay may occur. In this case, testing the organic light emitting display devices 210 that receive a delayed signal may not be properly performed. For example, if a delay occurs in the scan control signal supplied to the first and second wiring groups 260 and 270, the scan driver 220 may operate erroneously. The erroneous operation of the scan driver 220 causes it to increase rapidly its power consumption, thereby further increasing the signal delay. Accordingly, the test for organic light emitting display devices 210 that shares a signal line with an organic light emitting display device 210 with a scan driver 220 operating erroneously, may not be performed reliably.

Because the power supplies and/or signals are simultaneously supplied from both sides of the wirings to the first and second wiring groups 260 and 270, organic light emitting display devices 210 operating erroneously due to a delay of the power supplies and signals generally are organic light emitting display devices positioned at a center part of the mother substrate 200.

If at least one of the organic light emitting display devices 210 is operating erroneously due to the delay of the power supplies and/or signals, the erroneous operation influences the test of organic light emitting display devices 210 sharing the power supply line or the signal line, such that testing adjacent organic light emitting display devices 210 may not be reliably performed.

If driving conditions of the individual organic light emitting display devices 210 are set such that they are different from one another, the test of the sheet unit may be performed, but such a setting is not conducive to mass production testing. On the other hand, by turning off organic light emitting display devices 210 operating erroneously due to an internal defect or the delay of the power supplies and/or signals, the test of the sheet unit may be performed normally. Providing the ability to turn off erroneously operating organic light emitting display devices 210 improves the reliability and efficiency of the test.

However, although the test for a particular organic light emitting display device 210 can be performed using power supply lines formed in different directions, the test cannot be carried out after turning off a particular organic light emitting display device 210 operating erroneously.

Therefore, a scheme to turn on/off separately the respective organic light emitting display devices 210 formed on the mother substrate 200 is desired. This scheme is provided through a second embodiment of the present invention.

Figure 3:
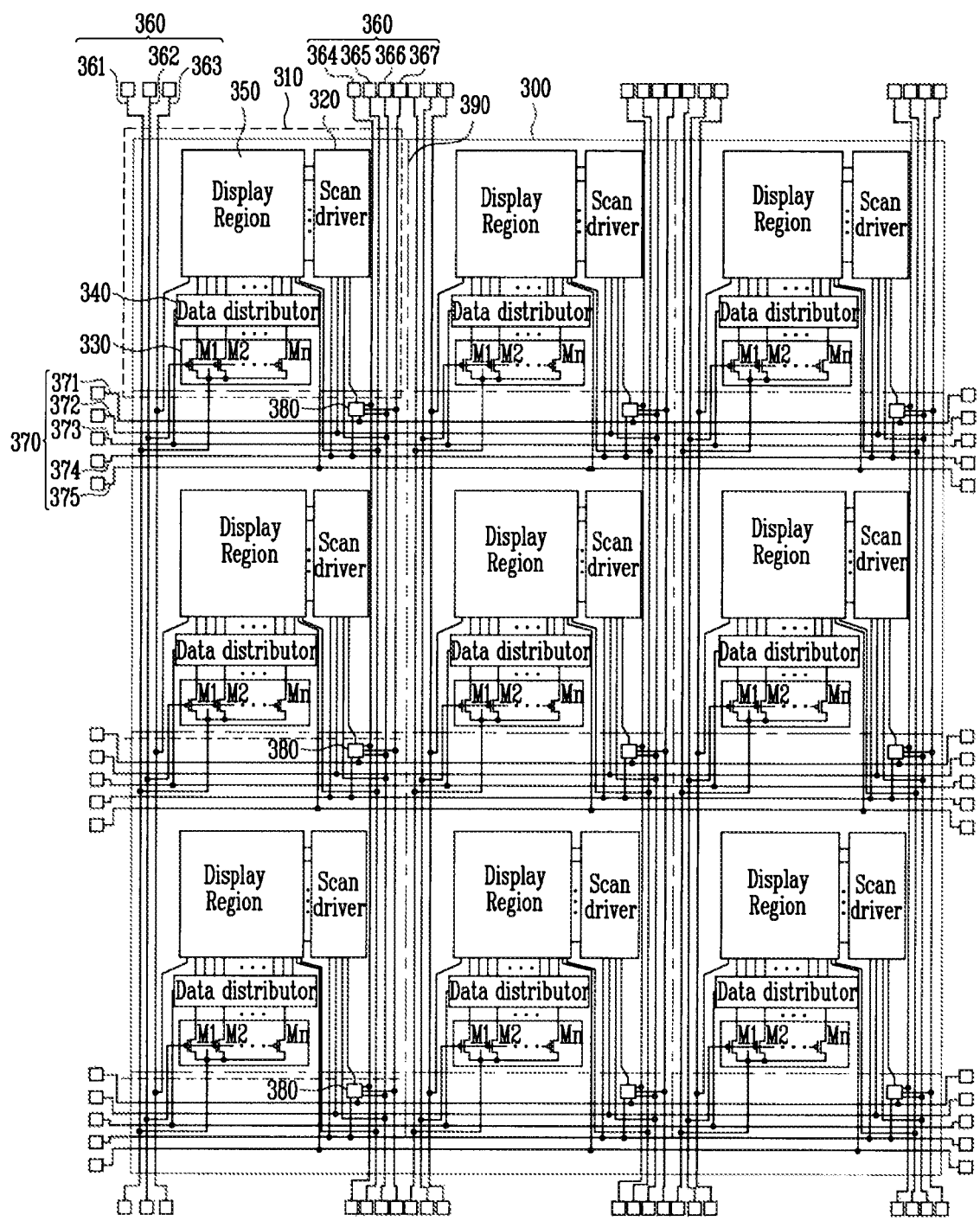
FIG. 3 shows a mother substrate of an organic light emitting display device according to a second embodiment of the present invention.
Figure 4:
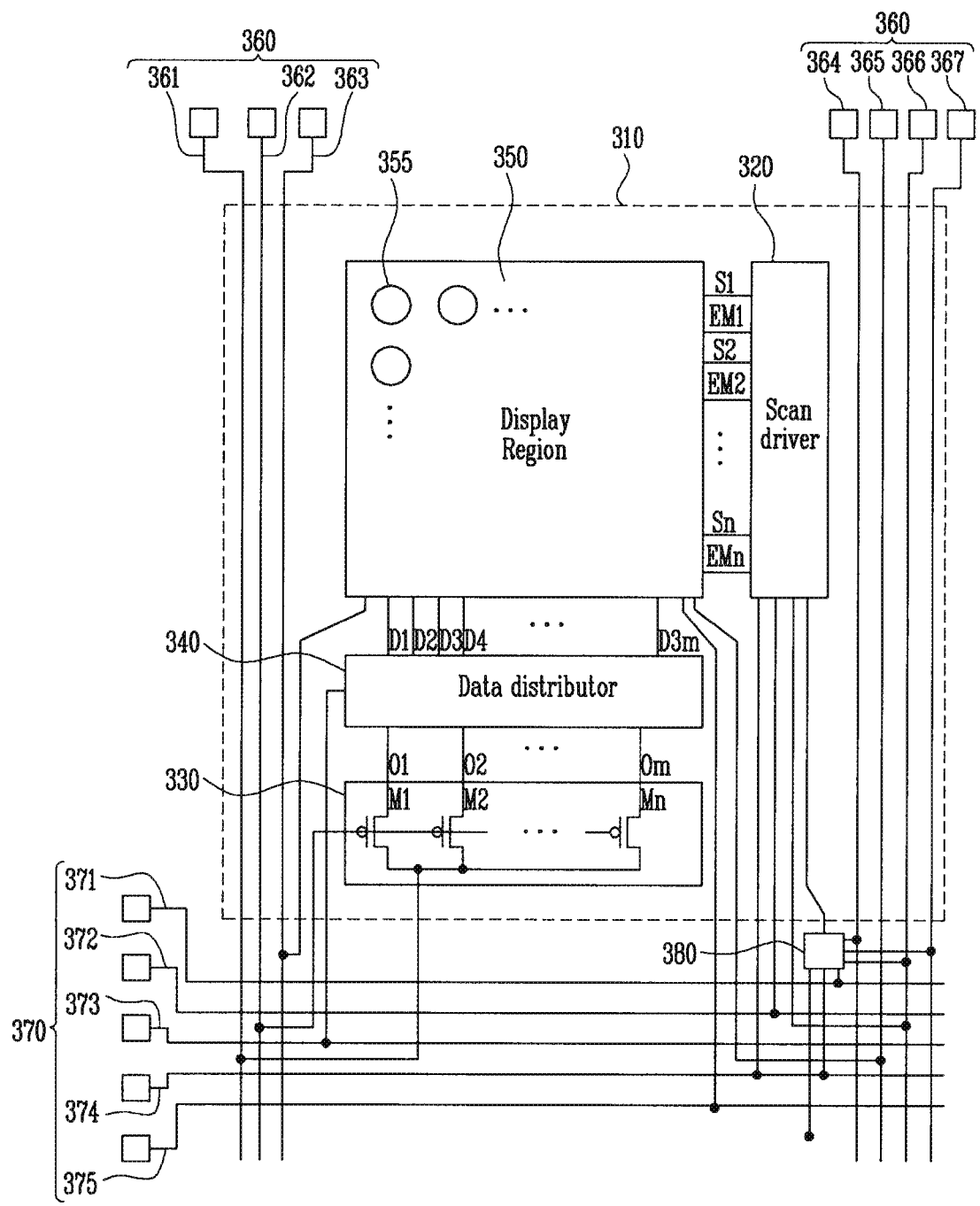
FIG. 4 shows an individual organic light emitting display device from the mother substrate shown in FIG. 3.

FIG. 3 shows the mother substrate of an organic light emitting display device according to a second embodiment of the present invention. FIG. 4 show the organic light emitting display device shown in FIG. 3.

With reference to FIG. 3 and FIG. 4, the mother substrate 300 of an organic light emitting display device according to a second embodiment of the present invention includes a plurality of organic light emitting display devices 310, a first wiring group 360, a second wiring group 370, and an on/off controller 380. The plurality of organic light emitting display devices 310 are arranged in a form of a matrix. The first wiring group 360 and the second wiring group 370 are disposed at a peripheral region of each of the organic light emitting display devices 310. The on/off controller 380 is coupled between wirings included in the first and second wiring groups 360 and 370 and a scan driver 320.

Each of the organic light emitting display devices 310 includes the scan driver 320, a testing section 330, a data distributor 340, and a display region 350.

The scan driver 320 receives a third power supply VDD from a sixth wiring 366 included in the first wiring group 360, and a scan control signal and a fourth power supply VSS from a ninth wiring 372 and an eleventh wiring 374 included in the second wiring group 370, respectively. The scan driver 320 receives the first and the second shift clock signals SFTCLK and SFTCLKB from the on/off controller 380. The scan driver 320 generates a scan signal and an emission control signal corresponding to the third and the fourth power supplies VDD and VSS, the scan control signal, and the first and the second shift clock signals SFTCLK and SFTCLKB. The scan signal and the emission control signal generated by the scan driver 320 are provided to the display region 350 through scan lines S1 to Sn and emission control lines EM1 to EMn. When the scan driver 320 receives the first and the second shift clock signals SFTCLK and SFTCLKB to turn off the organic light emitting display device 310 from the on/off controller 380, it generates and provides a scan signal and an emission control signal corresponding thereto to the display region 350, thereby turning off the display region 350.

The testing section 330 includes a plurality of transistors M1 to Mn, which are coupled between a first wiring 361 of the first wiring group 360 and the data distributor 340. Respective gates of the transistors M1 to Mn are coupled with a second wiring 362 of the first wiring group 360. The testing section 330 supplies a testing signal supplied from the first wiring 361 to the data distributor 340 according to the testing control signal supplied from the second wiring 362. Here, the testing signal is used to determine whether or not the organic light emitting display device 310 is abnormal. A lighting testing signal or a leakage current testing signal is used as a testing signal for pixels included in the display region 350. After the test of the sheet unit executed on the mother substrate 300 is completed and respective organic light emitting display devices 310 are scribed, the testing section 330 is set to be in a turned off state. After the test of the sheet unit finishes, the testing section 330 remains as a transistor group maintained in a turned off state so as not to influence the operation of the organic light emitting display device 310. In order to turn off the testing section 330 after scribing, the transistors M1 to Mn of the testing section 330 receive a control signal indicating that they should remain turned off.

The data distributor 340 receives at least two select signals from a tenth wiring 373 included in the second wiring group 370. Although one wiring is shown as the tenth wiring 373 in FIG. 3 and FIG. 4, at least two wirings can be set corresponding to the number of select signals as the tenth wiring 373. For example, the data distributor 340 may receive clock signals CLR, CLG, and CLB of red, green, and blue sub-pixels from the tenth wiring 373. In this case, the tenth wiring 373 is formed by three wirings. The data distributor 340 provides a testing signal from respective output lines O1 to Om of the testing section 330 to at least two data lines D corresponding to a select signal at the time of testing the sheet unit. On the other hand, after the respective organic light emitting display devices 310 are scribed, the data distributor 340 provides a data signal from respective output lines of a data driver (not shown) to at least two data lines D corresponding to externally supplied select signals.

The display region 350 includes a plurality of pixels (355) each having an organic light emitting diode. The display region 350 receives a second power supply ELVSS and an initialization power supply Vinit from a third wiring 363 and a fifth wiring 365 of the first wiring group 360, respectively, and receives a first power supply ELVDD from a twelfth wiring 375 of the second wiring group 370. Further, the display region 350 receives a scan signal and an emission control signal from the scan driver 320, and receives a testing signal (or data signal) from the data distributor 340. The display region 350 displays a predetermined image corresponding to the first and second power supplies ELVDD and ELVSS, the initialization power supply Vinit, the scan signal, the emission control signal, and the testing signal (or data signal).

Although it is not shown, each of the organic light emitting display devices 310 may further include a data driver. After the respective organic light emitting display devices 310 are scribed from the mother substrate 300, the data driver generates and provides a data signal to the data distributor 340 corresponding to externally supplied data. The data driver can be mounted to be overlapped with the testing section 330.

The on/off controller 380 receives a vertical control signal, a third power supply VDD, and a first clock signal CLK1 from a fourth wiring 364, a sixth wiring 366, and a seventh wiring 367 of the first wiring group 360. Further, the on/off controller 380 receives a horizontal control signal and a fourth power supply VSS from an eighth wiring 371 and an eleventh wiring 374 of the second wiring group 370. The on/off controller 380 generates and provides first and second shift clock signals SFTCLK and SFTCLKB having a voltage value of the third or fourth power supply VDD, VSS to the scan driver 320 according to the vertical control signal, the horizontal control signal, and the first clock signal CLK1.

So as to turn off selectively an organic light emitting display device 310 operating erroneously at the time of testing a sheet unit, the on/off controller 380 receives predetermined vertical and horizontal control signals from the fourth wiring 364 and the eighth wiring 371, which are coupled with the organic light emitting display device 310. Accordingly, the on/off controller 380 generates and provides the first and second shift clock signals SFTCLK and SFTCLKB to the scan driver 320 to turn off the display region irrespective of the first clock signal CLK inputted thereto. The scan driver 320 generates scan signals and emission controls signal to turn off the display region according to the first and second shift clock signals SFTCLK and SFTCLKB from the on/off controller 380. The on/off controller 380 generates and provides the first and second shift clock signals SFTCLK and SFTCLKB synchronized with the first clock signal CLK to the scan driver 320. Accordingly, the scan driver 320 generates scan signals and emission control signals according to the first and second shift clock signals SFTCLK and SFTCLKB, causing the display region 350 to be turned on.

The first wiring group 360 is formed in a vertical direction (first direction), and is coupled with the organic light emitting display devices 310 arranged in the same column on the mother substrate 300. The first wiring group 360 includes a first wiring 361 for receiving a testing signal, a second wiring 362 for receiving a testing control signal, a third wiring 363 for receiving a second power supply ELVSS, a fourth wiring 364 for receiving a vertical control signal, a fifth wiring 365 for receiving an initialization power supply Vinit, a sixth wiring 366 for receiving a third power supply VDD, and a seventh wiring 367 for receiving a first clock signal CLK1.

The first wiring 361 provides a testing signal to the testing section 330 at the time of testing the sheet unit, which is formed at the organic light emitting display devices 310 and is connected to the first wiring 361.

The second wiring 362 provides a testing control signal to the testing section 330 supplied at the time of testing the sheet unit, which is formed at the organic light emitting display devices 310 and is connected to the second wiring 362.

The third wiring 363 provides a second power supply VSS to a display region 350 at the time of testing the sheet unit, which is formed at the organic light emitting display devices 310 and is connected to the third wiring 363.

The fourth wiring 364 provides a vertical control signal to the on/off controller 380 at the time of testing the sheet unit. The on/off controller is connected to the fourth wiring 364.

The fifth wiring 365 provides an initialization power supply Vinit to the display region 350 at the time of testing the sheet unit, which is formed at the organic light emitting display devices 310 and is connected to the fifth wiring 365.

The sixth wiring 366 provides a third power supply VDD to the scan driver 320 and the on/off controller 380 at the time of testing the sheet unit, which are formed at the organic light emitting display devices 310 and is connected to the sixth wiring 366.

The seventh wiring 367 provides a first clock signal CLK1 to the on/off controller 380 at the time of testing the sheet unit. The on/off controller is connected to the seventh wiring 367.

The second wiring group 370 is formed in a horizontal direction (second direction) and is coupled with the organic light emitting display devices 310 arranged in the same row on the mother substrate 300. The second wiring group 370 includes an eighth wiring 371 for receiving a horizontal control signal, a ninth wiring 372 for receiving a scan control signal, a tenth wiring 373 for receiving at least two select signals, an eleventh wiring 374 for receiving a fourth power supply VSS, and a twelfth wiring 375 for receiving a first power supply ELVDD.

The eighth wiring 371 provides the horizontal control signal to the on/off controller 380 at the time of testing the sheet unit. The on/off controller is connected to the eighth wiring 371.

The ninth wiring 372 provides the scan control signal to the scan driver 320 at the time of testing the sheet unit, which is formed at the organic light emitting display devices 310 and is connected to the ninth wiring 372. The scan control signal may include a scan clock signal SCLK, an output enable signal, and a start pulse. In practice, the number of wirings of the scan control signal supplied to the scan driver 320 can be changed according to the circuit arrangement of the scan driver 320. Accordingly, although the ninth wiring 372 is shown in FIG. 3 and FIG. 4 to have one wiring, the number of wirings of the ninth wiring 372 can be more than one.

The tenth wiring 373 provides at least two select signals to the data distributor 340 at the time of testing the sheet unit, which is formed at the organic light emitting display devices 310 and is connected to the eighth wiring 273. The number of the select signals may change according to the number of sub-pixels included in the display region 350. Accordingly, although the tenth wiring 373 is shown in FIG. 3 and FIG. 4 to have one wiring, the number of wirings of the tenth wiring 373 can vary according to the number of select signals.

The eleventh wiring 374 provides a fourth power supply VSS to the scan driver 320 and the on/off controller 380 at the time of testing the sheet unit, which are formed at the organic light emitting display devices 310 and is connected to the eleventh wiring 374.

The twelfth wiring 375 provides a first power supply ELVDD to the display region 350 at the time of testing the sheet unit, which are formed at the organic light emitting display devices 310 and is connected to the twelfth wiring 375.

After the test of the sheet unit is completed, the organic light emitting display devices 310 formed on the mother substrate 300 are scribed to individual organic light emitting display devices 310. In order to prevent noise such as externally introduced static electricity from influencing the operation of the organic light emitting display 310 after scribing, the first wiring group 360 and the second wiring group 370 are electrically isolated from the on/off controller 380, the scan driver 320, the testing section 330, the data distributor 340, and the display region 350.

Although it has been described that the first to seventh wirings 361 to 367 and the eighth to twelfth wirings 371 to 375 are set to be included in one of the first and second wiring groups 360 and 370, the present embodiments are not limited thereto. For example, the twelfth wiring 375 supplying the first power supply ELVDD can be set to be included in both or one of the first and second wiring groups 360 and 370.

Hereinafter, a method of performing a test of the sheet unit on the mother substrate 300 of an organic light emitting display device according to a second embodiment will be explained with reference to FIG. 5.

Figure 5:
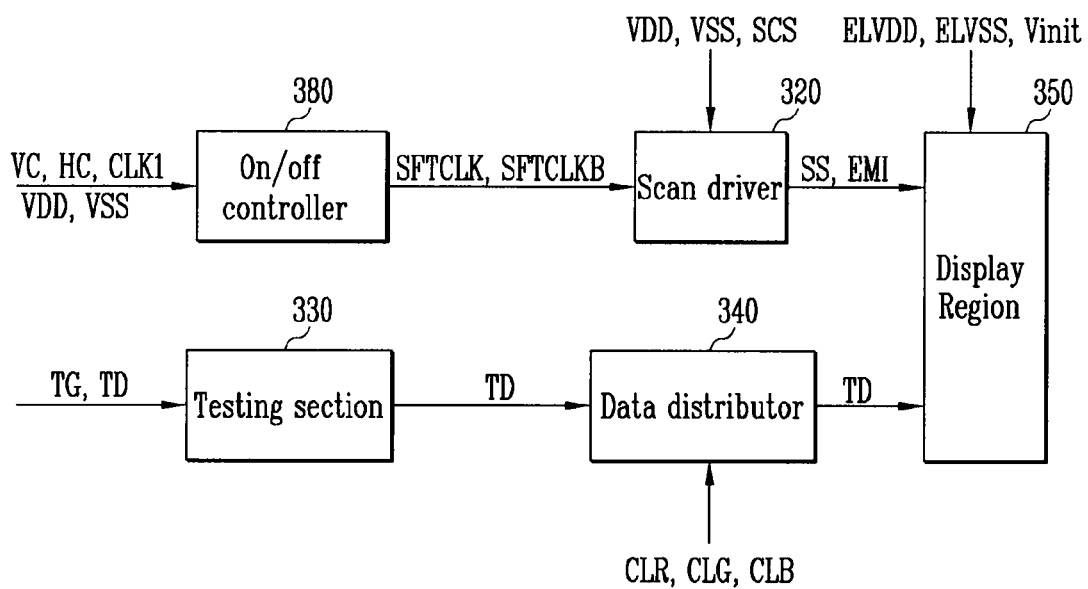
FIG. 5 is a block diagram showing a sheet unit testing method in the organic light emitting display device shown in FIG. 3 and FIG. 4.

Referring to FIG. 5, when vertical and horizontal control signals VC and HC, a first clock signal CLK1, and third and fourth power supplies VDD and VSS are supplied to the on/off controller 380, the on/off controller 380 generates and provides first and second shift clock signals SFTCLK and SFTCLKB to the scan driver 320. In order to perform a test for the organic light emitting display device 310 coupled with the on/off controller 380, the on/off controller 380 outputs a first shift clock signal SFTCLK synchronized with a first clock signal CLK and a second shift clock signal SFTCLKB, which has a waveform inverted to that of the first shift clock signal SFTCLK.

When the scan driver 320 receives the first and second shift clock signals SFTCLK and SFTCLKB, it generates and provides a scan signal SS and an emission control signal EMI to the display region 350 based on the first and second shift clock signals SFTCLK and SFTCLKB, and the third power supply VDD, the fourth power supply VSS, and the scan control signal SCS supplied externally.

The testing section 330 receives a testing control signal TG and a testing signal TD externally. The testing section 330 provides the testing signal TD to the data distributor 340 according to the testing control signal TG.

When the data distributor 340 receives the testing signal TD, it provides the testing signal TD to sub-pixels of the display region 350 according to an externally supplied select signal. In one embodiment, externally supplied select signals include a red clock signal CLR, a green clock signal CLG, and a blue clock signal CLB.

Accordingly, when the display region 350 receives the scan signal SS, the emission control signal EMI, and the testing signal TD, it displays a predetermined image corresponding to the received signals. To do this, the display region 350 further receives the first power supply ELVDD, the second power supply ELVSS, and the initialization power supply Vinit externally. Currently, when a lighting testing signal is applied as the testing signal, the pixels emit light corresponding to the lighting testing signal. Some of the pixels may emit light in an undesirable pattern. Based on the undesirable pattern, the embodiments of the present invention can determine whether there are abnormal pixels. Further, because the same lighting testing signal is supplied to the pixels, the embodiments of the present invention can measure the white balance of the pixels and can sense progressive abnormality. In addition, when a signal to test the leakage current is applied as the testing signal, a test for the leakage current for selected organic light emitting display devices 310 is performed. Various tests for organic light emitting display devices can be performed as triggered by the type of testing signal.

Upon performing a test of the sheet unit for a plurality of organic light emitting display devices 310, individual organic light emitting display devices 310 may be turned off. In order to turn off a particular organic light emitting display device 310 that is operating erroneously due to an occurrence of an internal defect or the delay of an input signal, the on/off controller 380 receives a vertical control signal VC and a horizontal control signal HC that indicates the organic light emitting display device coupled with the on/off controller 380 should be turned off. Accordingly, the on/off controller 380 generates first and second shift clock signals SFTCLK and SFTCLKB to turn off the organic light emitting display device 310 regardless of the first clock signal CLK1, and provides the first and second shift clock signals SFTCLK and SFTCLKB to the scan driver 320, which is coupled with the on/off controller 380. Accordingly, the scan driver 320 generates a scan signal SS and an emission control signal EMI to turn off the display region 350, and provides the scan signal SS and the emission control signal EMI to the display region 350. As a result, the display region 350 is maintained in a turned off state.

According to the second embodiment, upon performing a test of the sheet unit on a mother substrate 300 of an organic light emitting display device, the control of the on/off controller 380 using the vertical and horizontal control signals VC and HC allows only a particular organic light emitting display device 310 to be selectively turned off. Because the fourth wiring 364 and the eighth wiring 371 for supplying the vertical and horizontal control signals VC and HC are formed in different directions, at least one on/off controller 380 coupled with the fourth wiring 364 and the eighth wiring 371 can be individually controlled. Thus, turning on/off the organic light emitting display devices 310 formed on the mother substrate 300 may be individually controlled. Consequently, at the time of testing the sheet unit, by selectively turning on/off particular organic light emitting display devices 310 operating erroneously, the particular organic light emitting display device 310 operating erroneously is prevented from influencing other organic light emitting display devices 310 sharing power supply lines and signal lines with it. Accordingly, upon performing a test of the sheet unit for a plurality of organic light emitting display devices 310 formed on the mother substrate 300, the reliance and efficiency of the test is enhanced.

A mother substrate 300 of an organic light emitting display device according to the second embodiment includes first and second wiring groups 360 and 370 formed in different directions. Therefore, power supplies and signals are supplied to only the first and second wiring groups 360 and 370 coupled with at least one particular organic light emitting display device 310. Accordingly, it is possible to test only a particular organic light emitting display device 310 among the plurality of organic light emitting display devices 310. For example, when a third power supply VDD, a scan control signal, and a fourth power supply VSS are supplied to the sixth wiring 366, the ninth wiring 372, and the eleventh wiring 374 coupled with a scan driver 320 formed at a predetermined organic light emitting display device 310, a predetermined test for a particular organic light emitting display device 310 that is disposed at a crossing of the sixth wiring 366, the ninth wiring 372, and the eleventh wiring 374 having received the third power supply VDD, the scan control signal, and the fourth power supply VSS can be performed. Or, a predetermined test for a particular organic light emitting display device 310 disposed at the crossing of the third wiring 363 and the twelfth wiring 375 formed in different directions can be performed by controlling the supply of the first and second power supplies ELVDD and ELVDD through the third wiring 363 and the twelfth wiring 375.

Figure 6:
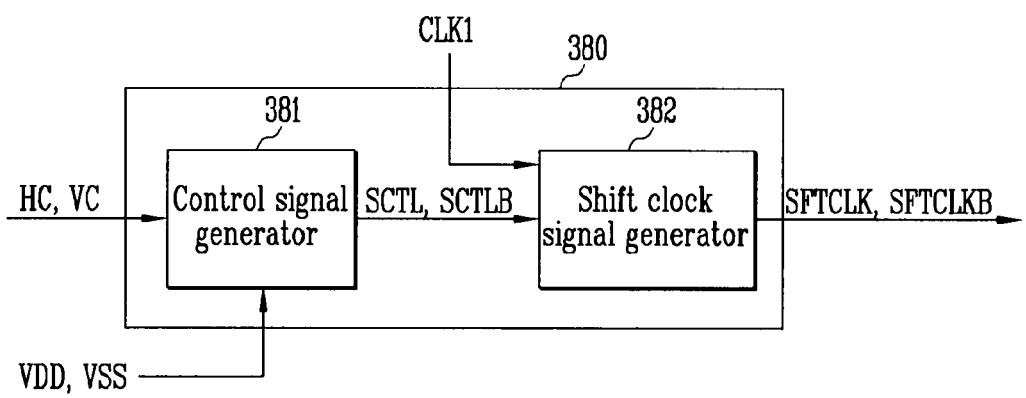
FIG. 6 shows an example of an on/off controller, which is shown in FIG. 3 to FIG. 5.
Figure 7:
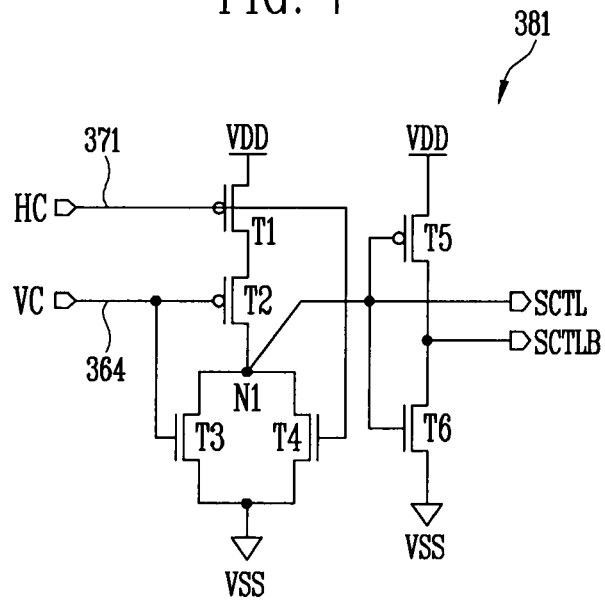
FIG. 7 shows an example of a control signal generator, which is shown in FIG. 6.
Figure 8:
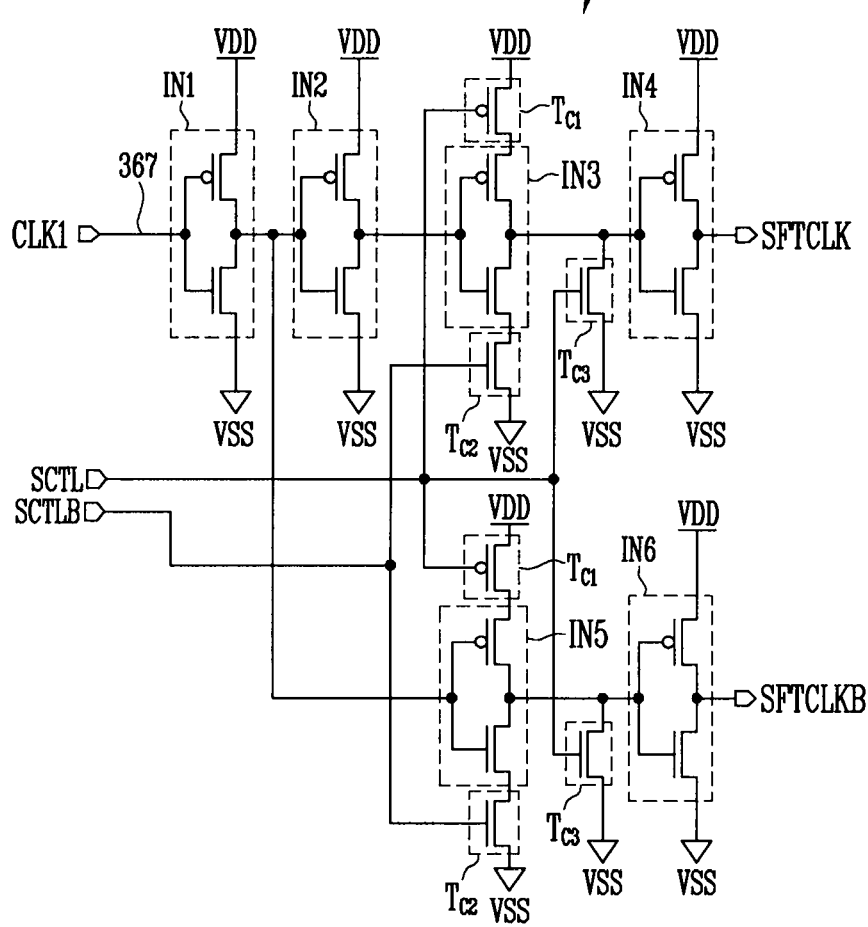
FIG. 8 shows an example of a shift clock signal generator, which is shown in FIG. 6.

FIG. 6 shows an example of an on/off controller shown in FIG. 3 to FIG. 5. FIG. 7 shows an example of a control signal generator shown in FIG. 6. FIG. 8 shows an example of a shift clock signal generator shown in FIG. 6.

With reference to FIG. 6, FIG. 7, and FIG. 8, the on/off controller 380 includes a control signal generator 381 and a shift clock signal generator 382. The shift clock signal generator 382 is coupled with an output terminal of the control signal generator 381.

The control signal generator 381 receives a vertical control signal VC and a horizontal control signal HC from a fourth wiring 364 and an eighth wiring 371, and generates first and second shift control signals SCTL and SCTLB according to the vertical control signal VC and the horizontal control signal HC.

In order to generate first and second shift control signals SCTL and SCTLB, the control signal generator 381 includes first through sixth transistors T1, T2, T3, T4, T5, and T6 as shown in FIG. 7.

The first and second transistors T1 and T2 are coupled with each other in series between the third power supply VDD and a first node N1. In this embodiment, T1 and T2 are P-type transistors. A gate electrode of the first transistor T1 receives the horizontal control signal HC from the eighth wiring 371, and a gate electrode of the second transistor T2 receives the vertical control signal VC from the fourth wiring 364.

The third and fourth transistors T3 and T4 are coupled with each other in parallel between the second transistor T2 and the fourth power supply VSS. In the described embodiment, T3 and T4 are N-type transistors. The fourth power supply VSS has a voltage value less than that of the third power supply VDD. A gate electrode of the third transistor T3 receives a vertical control signal VC from the fourth wiring 364, and a gate electrode of the fourth transistor T4 receives a horizontal control signal HC from the eighth wiring 371.

The fifth and sixth transistors T5 and T6 are coupled with each other in series between the third power supply VDD and the fourth power supply VSS. The fifth and sixth transistors T5 and T6 are set by different channel transistors. In the described embodiment, the fifth transistor T5 is a P-type transistor, whereas the sixth transistor T6 is an N-type transistor. Gate electrodes of the fifth and sixth transistors T5 and T6 are coupled with a first node N1 at which the second, third, and fourth transistors T2, T3, and T4 are coupled. The fifth and sixth transistors operate as an inverter for inverting the signal supplied to the first node N1.

When both the vertical control signal VC and the horizontal control signal HC are at low level, the first transistor T1 and the second transistor T2 are turned on and therefore the first node N1 will receive voltage from the third supply VDD. Hence, the control signal generator 381 will output VDD as the first shift control signal SCTL. The control signal generator 381 inverts the first shift control signal SCTL and outputs the inverted signal as the second shift control signal SCTLB. When both the vertical control signal VC and the horizontal control signal HC are at a high level, the third transistor T3 and the fourth transistor T4 are turned on and therefore the first node N1 will receive voltage from the fourth power supply VSS. Hence, the control signal generator 381 will output VSS as the first shift control signal SCTL. In addition, the control signal generator 381 will output a second shift control signal SCTLB, which will be of a high level, as it is the inverted SCTL signal. In the described embodiment, the control signal generator 381 operates as a NOR gate.

The shift clock signal generator 382 receives a first clock signal CLK1 from a seventh wiring 367, and the first and second shift control signals SCTL and SCTLB from the control signal generator 381. The shift clock signal generator 382 generates first and second shift clock signals SFTCLK and SFTCLKB corresponding to the first clock signal CLK1, and the first and second shift control signals SCTL and SCTLB.

In order to do this, as shown in FIG. 8, the shift clock signal generator 382 includes a plurality of inverters IN1 to IN6, first control transistors Tc1, second control transistors Tc2, and third control transistors Tc3. Each of the inverters IN1 to IN6 includes two different types of transistors, which are connected to each other in series. The first control transistors Tc1 are coupled between a P-type transistor included in corresponding inverters IN3 and IN5 and a third power supply VDD. The second control transistors Tc2 are coupled between an N-type transistor included in the corresponding inverters IN3 and IN5 and a fourth power supply VSS. The third control transistors Tc3 are coupled between an input terminal of corresponding inverters IN4 and IN6 and the fourth power supply VSS.

The inverters IN1, IN2, IN4, and IN6 include two different types of transistors, which are connected to each other in series between the third and fourth power supplies VDD and VSS. The input terminal of the first inverter IN1 is coupled with a seventh wiring 367, and the first inverter IN1 receives and inverts a first clock signal CLK1 from the seventh wiring 367. The input terminal of the second inverter IN2 is coupled with the output terminal of the first inverter IN1, and the second inverter IN2 receives and inverts a signal from the first inverter IN1. The input terminal of the third inverter IN3 is coupled with the output terminal of the second inverter IN2, and the third inverter IN3 receives and inverts a signal from the second inverter IN2. The input terminal of the fourth inverter IN4 is coupled with the output terminal of the third inverter IN3, and the fourth inverter IN4 receives and inverts a signal from the third inverter IN3. The input terminal of the fifth inverter IN5 is coupled with the output terminal of the first inverter IN1, and the fifth inverter IN5 receives and inverts a signal from the first inverter IN1. The input terminal of the sixth inverter IN6 is coupled with the output terminal of the fifth inverter IN5, and the sixth inverter IN6 receives and inverts a signal from the fifth inverter IN5.

The first control transistors Tc1 are P-type transistors. One is coupled between the third power supply VDD and the third inverter IN3. The other is coupled between the third power supply VDD and the fifth inverter IN5. Gate electrodes of the first control transistors Tc1 are coupled with the output terminal of the control signal generator 381 such that they receive a first shift control signal SCTL from the control signal generator 381. When the first shift control signal SCTL of low level is supplied to the first control transistors Tc1, the third and fifth inverters IN3 and IN5 are electrically connected to the third power supply VDD.

The second control transistors Tc2 are N-type transistors. One is coupled between the fourth power supply VSS and the third inverter IN3. The other is coupled between the fourth power supply VSS and the fifth inverter IN5. Gate electrodes of the second control transistors Tc2 are coupled with the output terminal of the control signal generator 381 and receive the second shift control signal SCTLB from the control signal generator 381. When the second shift control signal SCTLB is of high level and is supplied to the second control transistors Tc2, the third and fifth inverters IN3 and IN5 are electrically connected to the fourth power supply VSS.

The third control transistors Tc3 are N-type transistors. One is coupled between the fourth power supply VSS and the input terminal of the fourth inverter IN4. The other is coupled between the fourth power supply VSS and the input terminal of the sixth inverter IN6. Gate electrodes of the third control transistors Tc3 are coupled with the output terminal of the control signal generator 381 and receive the first shift control signal SCTL from the control signal generator 381. When the first shift control signal SCTL is of a high level and is supplied to the third control transistors Tc3, the input terminal of the fourth and sixth inverters IN4 and IN6 are electrically connected to the fourth power supply VSS.

When the first shift control signal SCTL of high level and the second shift control signal SCTLB of low level are received from the control signal generator 381, the shift clock signal generator 382 generates the first and second shift clock signals SFTCLK and SFTCLKB of high level irrespective of the first clock signal CLK1. When the first shift control signal SCTL of high level and the second shift control signal SCTLB of low level are supplied to the shift clock signal generator 382, the first and second control transistors Tc1 and Tc2 are turned off and the third control transistors Tc3 are turned on to provide the fourth power supply VSS of low level to the input terminals of the fourth and sixth inverters IN4 and IN6. Then, the fourth and sixth inverters IN4 and IN6 invert the fourth power supply VSS of low level and output the inverted signals as the first and second shift clock signals SFTCLK and SFTCLKB of high level. Thus, when the first shift control signal SCTL of high level and the second shift control signal SCTLB of low level are supplied from the control signal generator 381, the shift clock signal generator 382 outputs the first and second shift clock signals of high level regardless of the first clock signal CLK1.

The first and second shift clock signals SFTCLK and SFTCLKB of high level generated by the shift clock signal generator 382 are inputted to the scan driver 320 and the scan driver 320 turns off the display region 350. A detailed description thereof will be provided later.

When the shift clock signal generator 382 receives the first shift control signal SCTL of low level and the second shift control signal SCTLB of high level, the shift clock generator 382 generates a first shift clock signal SFTCLK having the same waveform as that of the first clock signal CLK1 and a second shift clock signal SFTCLKB having a different waveform from that of the first shift clock signal SFTCLK. That is, when the first shift control signal SCTL of low level and the second shift control signal SCTLB of high level are supplied to the shift clock signal generator 382, the third control transistors Tc3 are turned off and the first and second control transistors Tc1 and Tc2 are turned on to operate normally the third and fifth inverters IN3 and IN5. Then, the first clock signal CLK1 of an original waveform is outputted through first to fourth inverters IN1 to IN4 as the first shift clock signal SFTCLK. Further, the first clock signal CLK1 of an inverted waveform is outputted through first, fifth, and sixth inverters IN1, IN5, and IN6 as the second shift clock signal SFTCLKB. Next, the scan driver 320 generates and provides a scan signal and an emission control signal to the display region 350 in response to the first clock signal CLK1, so that a predetermined test for the organic light emitting display device 310 can be performed. The on/off controller 380 is shown in FIG. 6, FIG. 7, and FIG. 8 as an example, but the embodiments of the present invention are not limited thereto. In practice, the on/off controller 380 can be variously set to turn on/off of an organic light emitting display device 310 coupled with the on/off controller 380.

Figure 9:
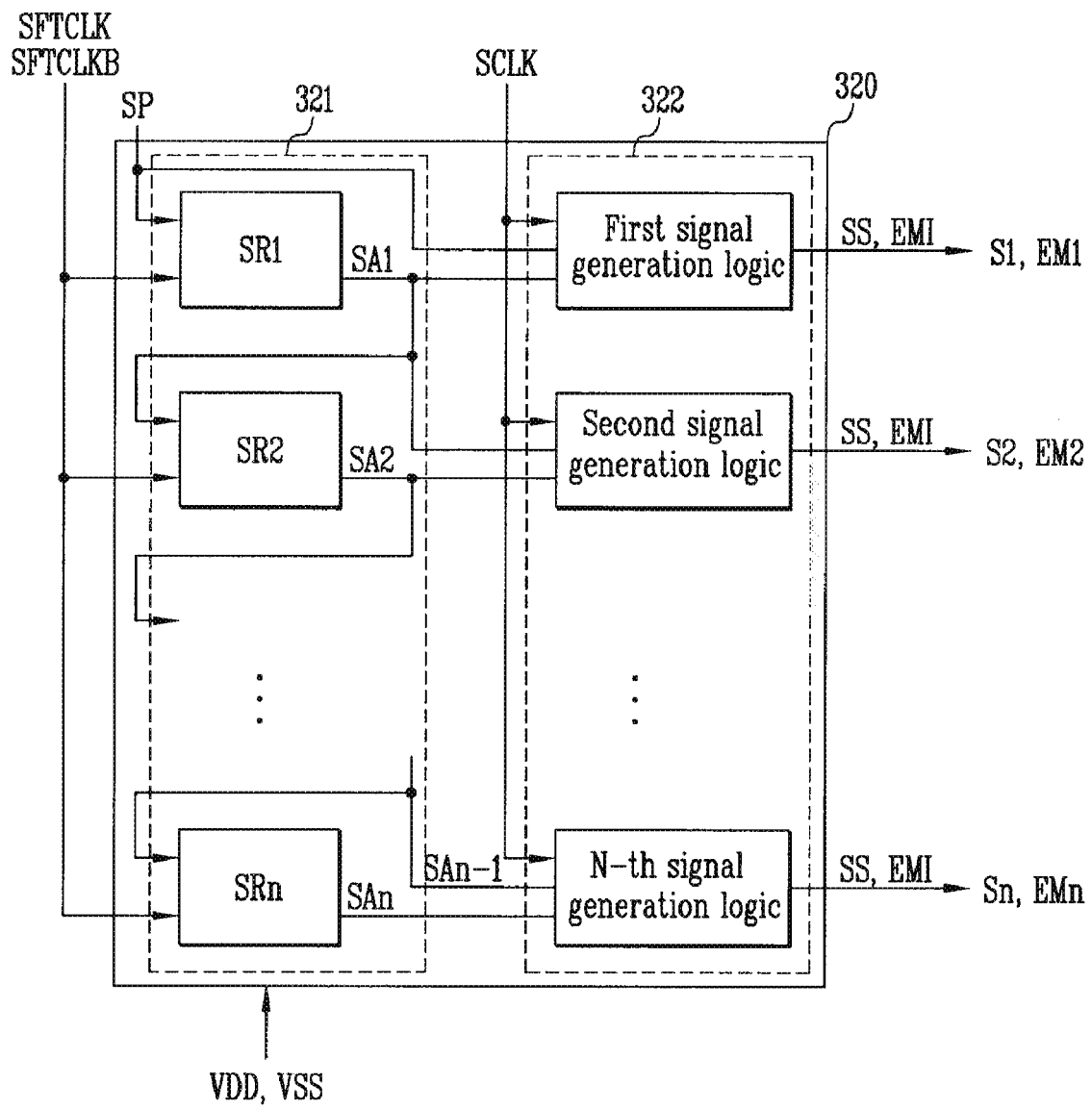
FIG. 9 shows an example of a scan driver, which is shown in FIG. 3 to FIG. 5.
Figure 10:
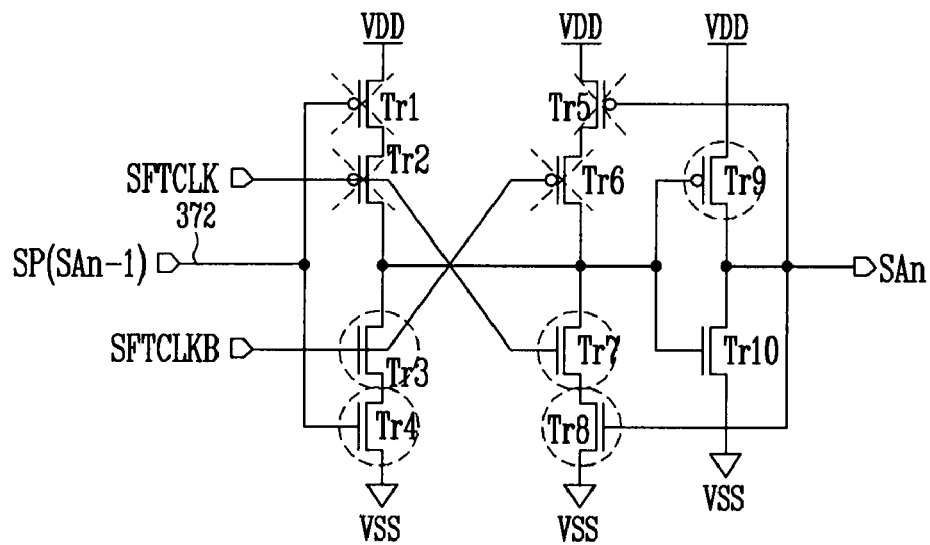
FIG. 10 shows an example of a shift register, which is shown in FIG. 9.
Figure 11:
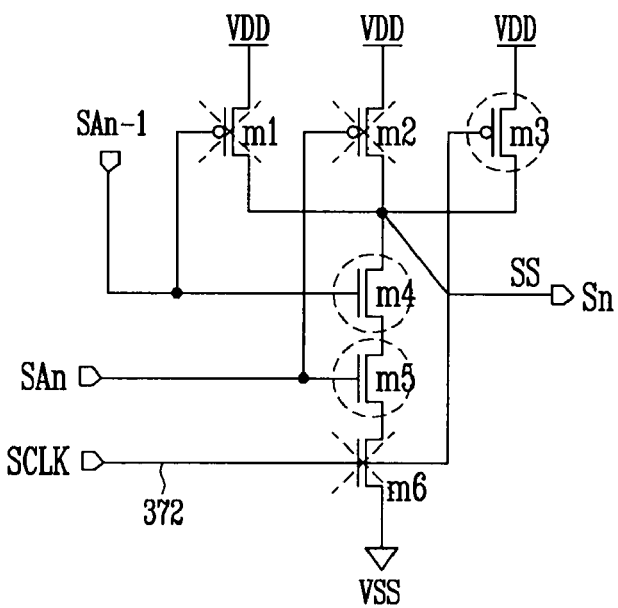
FIG. 11 shows an example of signal generation logic, which is shown in FIG. 9.

FIG. 9 shows an example of the scan driver shown in FIG. 3, FIG. 4, and FIG. 5. FIG. 10 shows an example of the shift register shown in FIG. 9. FIG. 11 shows an example of the signal generation logic shown in FIG. 9.

With reference to FIG. 9, FIG. 10, and FIG. 11, the scan driver 320 includes a shift register unit 321 and a signal generator unit 322.

The shift register unit 321 includes first through nth shift registers SR1 through SRn. Each of the shift registers SR1 through SRn generates a sampling pulse SA using a start pulse SP included in a scan control signal from the ninth wiring 372 (or a sampling pulse SAn−1 of a previous state) and the first and second shift clock signals SFTCLK and SFTCLKB from the on/off controller 380. Each of the shift registers SR1 through SRn provides the sampling pulse SA to the signal generator unit 322 and a shift register SRn+1 of a next stage. When the shift register SR receives the first and second shift clock signals SFTCLK and SFTCLKB of high level, and a start pulse SP (or, the sampling pulse SA of the previous state) of high level, it outputs a sampling pulse of high level.

This will be explained in detail with reference to FIG. 10. Each shift register SR includes a plurality of transistors Tr1 to Tr10, which are coupled between a third power supply VDD and a fourth power supply VSS.

First to fourth transistors Tr1 to Tr4 are coupled in series between the third power supply VDD and the fourth power supply VSS. The gate electrodes of the first and fourth transistors Tr1 and Tr4 receive the start pulse SP (or sampling pulse SAn−1 of a previous stage). The gate electrode of the second transistor Tr2 receives the first shift clock signal SFTCLK. The gate electrode of the third transistor Tr3 receives the second shift clock signal SFTCLKB.

Fifth to eighth transistors Tr5 to Tr8 are coupled in series between the third power supply VDD and the fourth power supply VSS. The gate electrodes of the fifth and eighth transistors Tr5 and Tr8 are coupled to the ninth and tenth transistors Tr9 and Tr10. The gate electrode of a sixth transistor Tr6 receives the second shift clock signal SFTCLKB and the gate electrode of a seventh transistor Tr7 receives the first shift clock signal SFTCLK.

The ninth and tenth transistors Tr9 and Tr10 are set by a different type of transistor, and are coupled in series between the third power supply VDD and the fourth power supply VSS. The ninth and tenth transistors Tr9 and Tr10 operate as an inverter. The gate electrodes of the ninth and tenth transistors Tr9 and Tr10 are coupled to one electrode of the second, third, sixth, and seventh transistors Tr2, Tr3, Tr6, and Tr7.

The first, second, fifth, sixth, and ninth transistors Tr1, Tr2, Tr5, Tr6, and Tr9 are set by a P-type transistor, whereas the third, fourth, seventh, eighth, and tenth transistors Tr3, Tr4, Tr7, Tr8, and Tr10 are set by an N-type transistor.

When the first and second shift clock signals SFTCLK and SFTCLKB of high level and the start pulse SP (or sampling pulse SA of the previous state) of high level are supplied to the shift register SR, the first, second, fifth, and sixth transistors Tr1, Tr2, Tr5, and Tr6 are turned off, but the third, fourth, seventh, and eighth transistors Tr3, Tr4, Tr7, and Tr8 are turned on. Accordingly, the fourth power supply VSS of low level is supplied to the input terminals of the ninth and tenth transistors Tr9 and Tr10, and the ninth and tenth transistors Tr9 and Tr10 invert the fourth power supply VSS of low level, and output a sampling pulse SAn of high level.

The signal generator unit 322 is coupled with the output terminal of the shift register unit 321. The signal generator unit 322 includes first to nth signal generation logics. Each signal generation logic receives a sampling pulse SAn and a sampling pulse SAn−1 of a previous stage, and receives a scan clock signal SCLK included in a scan control signal from the ninth wiring 372. The signal generator unit 322 generates and provides a scan signal SS to a scan line Sn using the sampling pulses SAn−1 and SAn, and the scan clock signal SCLK. When the signal generator unit 322 receives the sampling pulses SAn−1 and SAn of high level, and the scan clock signal SCLK of low level, it outputs a scan signal SS of high level to turn off the display region 350.

The operation of the signal generator unit 322 will now be described in detail with reference to FIG. 11. Each of the signal generation logics includes first to sixth transistors m1 to m6. The second, fourth, fifth, and sixth transistors m2, m4, m5, and m6 are coupled in series between the third power supply VDD and the fourth power supply VSS. The first and third transistors m1 and m3 are coupled with the second transistor m2 in parallel.

Gate electrodes of the first and fourth transistors m1 and m4 receive a sampling pulse SAn−1 of a previous stage and gate electrodes of the second and fifth transistors m2 and m5 receive the sampling pulse SA. Gate electrodes of the third and sixth transistors m3 and m6 receive the scan clock signal SCLK. In the described embodiment, the first to third transistors m1 to m3 are P-type transistors, and the fourth to sixth transistors m4 to m6 are N-type transistors.

When the sampling pulse, SAn−1 and SAn of high level, and the scan clock signal SCLK of low level are supplied to the signal generation logic, the first, second, and sixth transistors m1, m2, and m6 transistors are turned off and the third to fifth transistors m3 to m5 are turned on. Accordingly, the output terminal of the signal generation logic outputs the scan signal SS of high level. The scan signal SS of high level generated by the signal generator unit 322 is supplied to the scan lines S1 to Sn to turn off the display region 350. A detailed description thereof will be provided later.

The scan driver 320 generates an emission control signal EMI as well as the scan signal SS. To do this, the scan driver 320, particularly the signal generator unit 322, may include emission control signal (EMI) generation logic (not shown). The emission control signal (EMI) generation logic can be embodied to have at least one transistor. According to an embodiment of the present invention, when the scan driver 320 receives the first and second shift clock signals SFTCLK and SFTCLKB to turn off the organic light emitting display device 310 from the on/off controller 380, the scan driver 320 generates an emission control signal EMI to turn off the display region 350. For example, when transistors of the display region are set by a P-type transistor, the scan driver 320 generates and provides an emission control signal EMI of high level to the display region 350. Accordingly, the display region 350, having received the emission control signal EMI, is logically turned off. Although an internal arrangement of the scan driver 320 is shown in FIG. 9 to FIG. 11, the embodiments of the present invention are not limited thereto.

Figure 12:
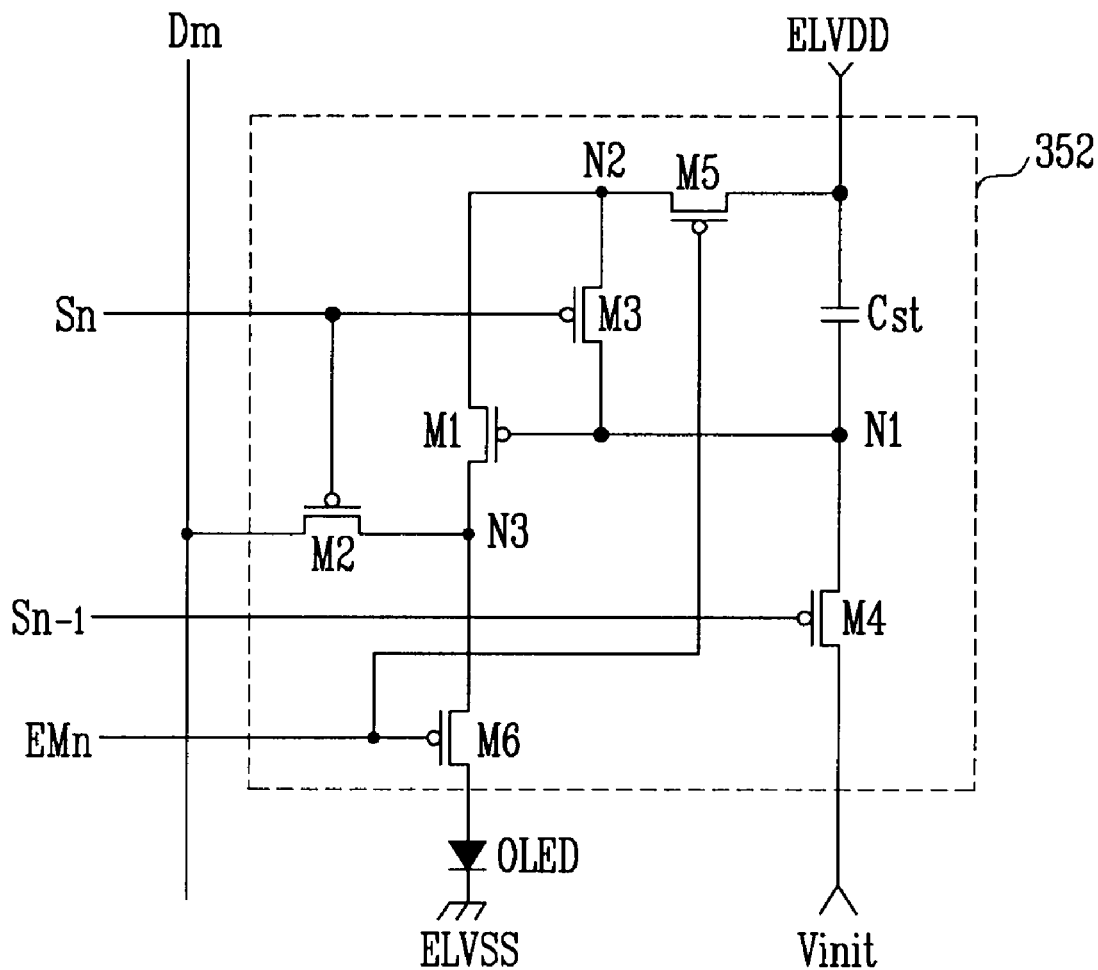
FIG. 12 shows an example of a pixel included in the display region shown in FIG. 3 to FIG. 5.
Figure 13:
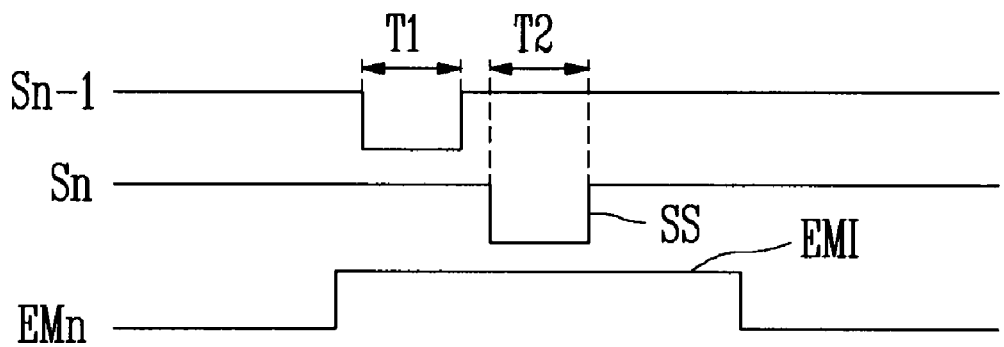
FIG. 13 is a waveform diagram of a control signal to control the pixel circuit shown in FIG. 12.
Figure 14:
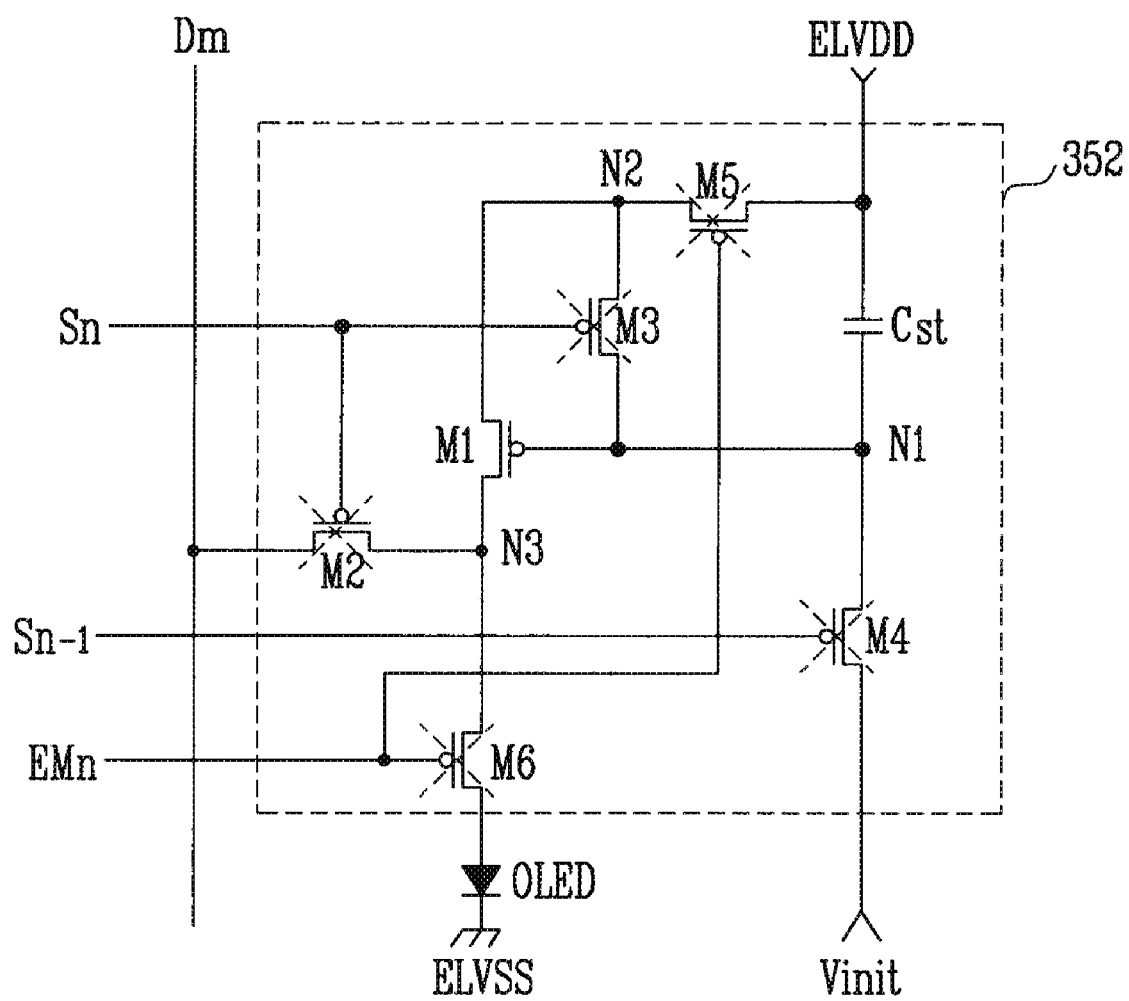
FIG. 14 is a circuit diagram showing that the pixel circuit shown in FIG. 12 is logically turned off when a scan signal and an emission control signal of a high level are supplied thereto.

FIG. 12 shows an example of a pixel included in the display region shown in FIG. 3 to FIG. 5. FIG. 13 is a waveform diagram of a control signal to control the pixel circuit shown in FIG. 12. FIG. 14 is a circuitry diagram showing that the pixel circuit shown in FIG. 12 is logically turned off when a scan signal and an emission control signal of high level are supplied thereto.

With reference to FIG. 12 to FIG. 14, the pixel includes an organic light emitting diode OLED and a pixel circuit 352 coupled with an n-th scan line Sn, an n-th emission control line EMn, an m-th data line Dm, a first power supply ELVDD, an initialization power supply Vinit, and the organic light emitting diode OLED.

The anode of the organic light emitting diode OLED is coupled with the pixel circuit 352 and the cathode thereof is coupled with a second power supply ELVSS.

The pixel circuit 352 includes first to sixth transistors M1 to M6, and a storage capacitor Cst. The first to sixth transistors M1 to M6 are shown in FIG. 12 as P-type transistors. However, the embodiments of the present invention are not limited thereto.

A first electrode of the first transistor M1 is coupled to a second node N2, and a second electrode thereof is coupled to a third node N3. The gate electrode of the first transistor M1 is coupled to a first node N1. The first transistor M1 provides an electric current corresponding to the voltage stored in the storage capacitor Cst to the third node N3.

A first electrode of the second transistor M2 is coupled to an m-th data line Dm, and a second electrode thereof is coupled to the third node N3. The gate electrode of the second transistor M2 is coupled to an n-th scan line Sn. When the scan signal is supplied to the n-th scan line Sn, the second transistor M2 is turned on to provide a data signal supplied to an m-th data line Dm to the third node N3.

A first electrode of the third transistor M3 is coupled to the second node N2, and a second electrode thereof is coupled to the first node N1. The gate electrode of the third transistor M3 is coupled to the n-th scan line Sn. When the scan signal is supplied to the n-th scan line Sn, the third transistor M3 is turned on to cause the first transistor M1 to be diode-connected.

A first electrode of the fourth transistor M4 is coupled to an initialization power supply Vinit, and a second electrode thereof is coupled to the first node N1. The gate electrode of the fourth transistor M4 is coupled to an (n−1)-th scan line Sn−1. When the scan signal is supplied to the (n−1)-th scan line Sn−1, the fourth transistor M4 is turned on to initialize the storage capacitor Cst and the gate electrode of the first transistor M1. For that reason, the voltage value of the initialization power supply Vinit is set to be less than that of the data signal.

A first electrode of the fifth transistor M5 is coupled to a first power supply ELVDD, and a second electrode thereof is coupled to the second node N2. The gate electrode of the fifth transistor M5 is coupled to an n-th emission control line EMn. When an emission control signal is not supplied to the n-th emission control line EMn, the fifth transistor M5 is turned on to transfer a voltage of the first power supply ELVDD to the second node N2.

A first electrode of the sixth transistor M6 is coupled to the third node N3, and a second electrode thereof is coupled to the anode of the organic light emitting diode OLED. The gate electrode of the sixth transistor M6 is coupled to the n-th emission control line EMn. When an emission control signal is not supplied to the n-th emission control line EMn, the sixth transistor M6 is turned on to connect electrically the organic light emitting diode OLED to the third node N3.

One terminal of the storage capacitor Cst is coupled to the first power supply ELVDD and the first electrode of the fifth transistor M5, and another terminal thereof is coupled to the first node N1. When the scan signal is supplied to the n-th scan line, the storage capacitor Cst is charged with the data signal and the threshold voltage Vth of the first transistor M1 and maintains the charged voltage during one frame period.

An operation of the pixel will be described in detail. During a first period T1, the scan signal SS is supplied to the (n−1)-th scan line Sn−1, and an emission control signal EMI is supplied to the n-th emission control line EMn. When the emission control signal EMI has been supplied to the n-th emission control line EMn, the fifth and sixth transistors M5 and M6 are turned off. When the scan signal SS is supplied to the (n−1)-th scan line Sn−1, the fourth transistor M4 is turned on. When the fourth transistor M4 is turned on, the storage capacitor Cst and the gate electrode of the first transistor M1 are electrically coupled with the initialization power supply Vinit. When the storage capacitor Cst and the gate electrode of the first transistor M1 are electrically coupled with the initialization power supply Vinit, the initialization power supply Vinit is supplied to initialize the storage capacitor Cst and the gate electrode of the first transistor M1.

Next, during a second period T2, the scan signal is supplied to the n-th scan line Sn. When the scan signal SS is supplied to the n-th scan line Sn, the second and third transistors M2 and M3 are turned on. When the third transistor M3 is turned on, the first transistor M1 is diode-connected. When the second transistor M2 is turned on, the data signal supplied to the m-th data line Dm is transferred to the third node N3. Because the gate electrode of the first transistor M1 is initialized with a voltage less than that of the data signal by the initialization power supply Vinit, the voltage supplied to the third node N3 is provided to the first node N1 through the first and third transistors M1 and M3. Accordingly, the threshold voltage of the first transistor M1 and a voltage corresponding to the data signal are stored in the storage capacitor Cst.

Thereafter, when the emission control signal EMI is not supplied to the n-th emission control line EMn, the fifth and sixth transistors M5 and M6 are turned on. When the fifth and sixth transistors M5 and M6 are turned on, an electric current corresponding to the data signal flows from the first power supply ELVDD to the organic light emitting diode OLED. This causes the organic light emitting diode OLED to emit light corresponding to the data signal.

When the scan signal SS and the emission control signal EMI of high level are supplied to the pixel, as shown in FIG. 14, the second to sixth transistors M2 to M6 are all turned off, so that the pixel does not emit light. Consequently, so as to turn off a particular organic light emitting display device 310, the scan signal SS and the emission control signal EMI of high level need to be supplied to the display region 350. For example, upon performing the test of a sheet unit on the mother substrate 300, in order to turn off a particular organic light emitting display device 310, vertical and horizontal control signals VC and HC of low level can be supplied to the on/off controller 380, which is coupled with a particular organic light emitting display device 310. Accordingly, the on/off controller 380 supplies the first and second shift clock signals SFTCLK and SFTCLKB of high level to the scan driver 320, and the scan driver 320 generates a scan signal SS and an emission control signal EMI of high level corresponding thereto to turn off the pixels. In an embodiment of the present invention the switching transistors of the pixel are all P-type transistors. However, in practice, the method of turning off a particular organic light emitting display device 310 changes variously according to a circuit arrangement of the pixel As mentioned above, in an organic light emitting display device and a testing method thereof, because the organic light emitting display device includes first and second wiring groups, the embodiments of the present invention can perform a test of a sheet unit for a plurality of organic light emitting display devices formed on a mother substrate. This results in reduced testing time and costs, thereby enhancing the efficiency of the tests. Power supplies and signals are supplied to only the first and second wiring groups coupled with a particular organic light emitting display device, so that a single test can be performed for the particular organic light emitting display device among a plurality of organic light emitting display devices formed on a mother substrate.

Moreover, vertical and horizontal control signals supplied through wirings formed in different directions control the on/off controller, thereby allowing separate control of turning on/off individual organic light emitting display devices formed on the mother substrate. Accordingly, by selectively turning on/off a particular organic light emitting display device operating erroneously during the test of the sheet unit, the embodiments of the present invention can prevent an organic light emitting display device that is operating erroneously from influencing other organic light emitting display devices sharing power supply lines and signal lines with it. This functionality improves the reliance and the efficiency of the test.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display device comprising:
   a display region including a plurality of pixels connected to scan lines and data lines;
   a scan driver for supplying a scan signal to the scan lines;
   at least one of a first wiring group disposed at a peripheral region and extending in a first direction or a second wiring group disposed at the peripheral region and extending in a second direction; and
   a transistor group including a plurality of transistors coupled with one end of the data lines;
   wherein the display region is configured to be turned off by an on/off controller while other organic light emitting display devices on a same mother substrate as the organic light emitting display device are being tested, the on/off controller being coupled between at least one wiring of the first wiring group, at least one wiring of the second wiring group, and the scan driver, and
   wherein at least one of the first wiring group or the second wiring group extends from a first edge to a second edge of a portion of the mother substrate corresponding to the organic light emitting display device.

2. The organic light emitting display device as claimed in claim 1, wherein the on/off controller includes:
   a control signal generator for generating at least one shift control signal corresponding to signals from the first and second wiring groups; and
   a shift clock signal generator coupled with an output terminal of the control signal generator, wherein the shift clock generator is capable of generating first and second shift clock signals according to the shift control signal.

3. The organic light emitting display device as claimed in claim 1, wherein the plurality of transistors of the transistor group are adapted to maintain a turned off state according to an external control signal.

4. The organic light emitting display device as claimed in claim 1, further comprising:
   a data distributor, coupled between the data lines and the transistor group, for supplying a testing signal or a data signal to the data lines according to at least two select signals; and
   a data driver for supplying the data signal to the data distributor.

5. A method for testing a plurality of organic light emitting display devices located on a mother substrate, the method comprising:
   supplying a vertical control signal to a first wiring group coupled with the organic light emitting display devices disposed in a same column;
   supplying a horizontal control signal to a second wiring group coupled with the organic light emitting display devices disposed in a same row, the horizontal control signal being different from the vertical control signal, such that the second wiring group receives the horizontal control signal independently of the first wiring group;
   generating a first shift clock signal and a second shift clock signal corresponding to the vertical control signal and the horizontal control signal;
   generating a scan signal corresponding to the first shift clock signal and the second shift clock signal;
   supplying a testing signal to the first wiring group or the second wiring group; and
   displaying an image for a test corresponding to the scan signal and the testing signal.

6. The method as claimed in claim 5, wherein generating the first shift clock signal and the second shift clock signal comprises:
- generating at least one shift control signal corresponding to the vertical control signal and the horizontal control signal; and
- generating the first shift clock signal and the second shift clock signal corresponding to the shift control signal.

7. The method as claimed in claim 5, further comprising:
- generating said scan signal so that at least one organic light emitting display device among the organic light emitting display devices does not display an image according to the vertical control signal and the horizontal control signal.

8. The method as claimed in claim 7, further comprising:
- turning off switching transistors of pixels included in a display region of at least one organic light emitting display device among the organic light emitting display devices.

9. The method as claimed in claim 5, further comprising:
- receiving a first clock signal through the first wiring group or the second wiring group.

10. The method as claimed in claim 9, further comprising:
- generating the first shift clock signal having the same waveform as that of the first clock signal and the second shift clock signal having a waveform inverted to that of the first shift clock signal that correspond to the vertical control signal and the horizontal control signal.

11. The method as claimed in claim 5, further comprising:
- generating an emission control signal to control a display of an image for a test in one of the organic light emitting display devices according to the first shift clock signal and the second shift clock signal.

12. A method for fabricating a plurality of organic light emitting display devices comprising:
- fabricating the plurality of organic light emitting display devices on a mother substrate, wherein each organic light emitting display device includes a display region including a plurality of pixels connected to scan lines and data lines, a scan driver for supplying a scan signal to the scan lines, and a transistor group including a plurality of transistors coupled with one end of the data lines;
- testing the plurality of organic light emitting display devices by applying a first signal to a first wiring group extending in a first direction and a second signal to a second wiring group extending in a second direction on the mother substrate, the first signal being different from the second signal, the first wiring group being located between two adjacent ones of the organic light emitting display devices in the second direction and the second wiring group being located between two adjacent ones of the organic light emitting display devices in the first direction; and
- scribing the plurality of organic light emitting display devices to make individual organic light emitting display devices, wherein the first wiring group or the second wiring group of each individual organic light emitting display device is electrically disconnected from the transistor group and the scan driver,
- wherein the testing the plurality of organic light emitting display devices comprises selectively turning off an organic light emitting display device of the organic light emitting display devices while other organic light emitting display devices on the mother substrate are being tested.

* * * * *